(12) United States Patent
Sugiyama

(10) Patent No.: US 11,209,724 B2
(45) Date of Patent: *Dec. 28, 2021

(54) PROJECTOR INCLUDING COOLING TARGET

(71) Applicant: SEIKO EPSON CORPORATION, Tokyo (JP)

(72) Inventor: Nobuo Sugiyama, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/894,060

(22) Filed: Jun. 5, 2020

(65) Prior Publication Data

US 2020/0387057 A1    Dec. 10, 2020

(30) Foreign Application Priority Data

Jun. 6, 2019  (JP) .............................. JP2019-105946

(51) Int. Cl.
*G03B 21/16*    (2006.01)
*H05K 7/20*    (2006.01)
(Continued)

(52) U.S. Cl.
CPC ........... *G03B 21/16* (2013.01); *G03B 21/145* (2013.01); *G03B 21/208* (2013.01);
(Continued)

(58) Field of Classification Search
CPC .... G03B 21/008; G03B 21/16; G03B 21/208; G03B 21/145; H05K 7/20145; H05K 7/20154; H05K 7/20309; H05K 7/20327
See application file for complete search history.

(56) References Cited

U.S. PATENT DOCUMENTS 5,032,021 A * 7/1991 Kanatani ........... G02F 1/133385
353/54
6,713,973 B2    3/2004 Erhardt
(Continued)

FOREIGN PATENT DOCUMENTS

JP    H02-044144 A    2/1990
JP    H11-057383 A    3/1999
(Continued)

OTHER PUBLICATIONS

U.S. Appl. No. 16/898,598, filed Jun. 11, 2020 in the name of Sugiyama.
Sep. 30, 2021 Office Action Issued In U.S. Appl. No. 16/898,598.

*Primary Examiner* — Michelle M Iacoletti
*Assistant Examiner* — Magda Cruz
(74) *Attorney, Agent, or Firm* — Oliff PLC

(57) ABSTRACT

A projector including a cooling target includes a light source, a light modulator, a projection optical apparatus, and a cooler configured to cool the cooling target based on transformation of a refrigerant into a gas. The cooler includes a refrigerant generator configured to generate the refrigerant, a refrigerant sender configured to send the generated refrigerant toward the cooling target, and a cooling air blower configured to deliver air to the cooling target. The cooling target includes a cooling target main body and a cooled part which is thermally coupled to the cooling target main body and to which the refrigerant is sent from the refrigerant sender. The cooled part is disposed on a downstream of the cooling target main body in the flowing direction of the air delivered from the cooling air blower to the cooling target.

9 Claims, 7 Drawing Sheets

(51) Int. Cl.
   *G03B 21/14* (2006.01)
   *G03B 21/20* (2006.01)
   *G03B 21/00* (2006.01)

(52) U.S. Cl.
   CPC ..... *H05K 7/20145* (2013.01); *H05K 7/20154* (2013.01); *H05K 7/20309* (2013.01); *H05K 7/20327* (2013.01); *G03B 21/008* (2013.01)

(56) References Cited

U.S. PATENT DOCUMENTS

| | | | |
|---|---|---|---|
| 7,436,399 B2 | 10/2008 | Naito | |
| 7,438,420 B2 | 10/2008 | Harada et al. | |
| 7,448,759 B2 | 11/2008 | Fukano | |
| 7,737,387 B2 | 6/2010 | Hsu | |
| 7,824,038 B2 | 11/2010 | Yun et al. | |
| 7,891,819 B2* | 2/2011 | Osumi | G03B 21/16 353/54 |
| 8,277,050 B2 | 10/2012 | Furumi | |
| 8,517,540 B2 | 8/2013 | Terao | |
| 8,777,423 B2 | 7/2014 | Okada | |
| 8,979,280 B2 | 3/2015 | Sakamoto | |
| 9,022,573 B2 | 5/2015 | Shioya et al. | |
| 9,039,192 B2 | 5/2015 | Okazawa et al. | |
| 9,104,059 B2 | 8/2015 | Shioya et al. | |
| 9,116,419 B2 | 8/2015 | Terashima et al. | |
| 9,316,895 B2 | 4/2016 | Kubo | |
| 9,429,827 B2 | 8/2016 | Kubo | |
| 9,666,109 B2 | 5/2017 | Fukutomi et al. | |
| 9,857,671 B2* | 1/2018 | Asano | F21V 29/59 |
| 10,643,547 B2 | 5/2020 | Naitou | |
| 2002/0191159 A1* | 12/2002 | Nagao | H04N 9/3144 353/54 |
| 2003/0218602 A1 | 11/2003 | Naito | |
| 2004/0212787 A1 | 10/2004 | Kida et al. | |
| 2004/0239887 A1 | 12/2004 | Yasuda | |
| 2005/0219430 A1 | 10/2005 | Nagano | |
| 2005/0220156 A1* | 10/2005 | Kitabayashi | G02F 1/133385 372/35 |
| 2005/0242741 A1 | 11/2005 | Shiota et al. | |
| 2006/0082964 A1 | 4/2006 | Taniguchi et al. | |
| 2006/0120084 A1 | 6/2006 | Sueoka | |
| 2007/0051057 A1* | 3/2007 | Zakoji | G03B 21/16 52/171.3 |
| 2008/0030689 A1 | 2/2008 | Hsu | |
| 2008/0297053 A1 | 12/2008 | Yun et al. | |
| 2009/0058839 A1 | 3/2009 | Naito | |
| 2009/0086169 A1* | 4/2009 | Nakamura | G03B 21/006 353/31 |
| 2010/0132379 A1 | 6/2010 | Wu et al. | |
| 2010/0171935 A1* | 7/2010 | Yamagishi | G03B 21/16 353/52 |
| 2011/0025987 A1 | 2/2011 | Furumi | |
| 2011/0037954 A1 | 2/2011 | Tsuchiya et al. | |
| 2011/0234984 A1* | 9/2011 | Egawa | G03B 21/18 353/31 |
| 2011/0242499 A1 | 10/2011 | Terao | |
| 2012/0229710 A1 | 9/2012 | Okazawa et al. | |
| 2013/0107223 A1 | 5/2013 | Toyooka | |
| 2013/0128457 A1 | 5/2013 | Shioya et al. | |
| 2013/0128458 A1 | 5/2013 | Shioya et al. | |
| 2013/0148085 A1 | 6/2013 | Sakamoto | |
| 2013/0271736 A1 | 10/2013 | Terashima et al. | |
| 2014/0218693 A1 | 8/2014 | Kubo | |
| 2015/0009218 A1 | 1/2015 | Fukutomi et al. | |
| 2015/0010338 A1* | 1/2015 | Miyagawa | G03G 15/2021 399/341 |
| 2015/0029469 A1 | 1/2015 | Kubo | |
| 2016/0105652 A1 | 4/2016 | Yamashita | |
| 2017/0214892 A1* | 7/2017 | Nagatani | H04N 9/3155 |
| 2017/0374326 A1* | 12/2017 | Aikoh | F21V 7/22 |
| 2018/0239227 A1 | 8/2018 | Suzuki | |
| 2019/0005893 A1 | 1/2019 | Naitou | |
| 2019/0196311 A1 | 6/2019 | Sugiyama et al. | |
| 2019/0196312 A1* | 6/2019 | Sugiyama | F25B 19/00 |
| 2019/0196313 A1* | 6/2019 | Okada | F24F 3/14 |
| 2019/0271906 A1* | 9/2019 | Okada | H04N 9/3105 |

FOREIGN PATENT DOCUMENTS

| | | |
|---|---|---|
| JP | H11-169644 A | 6/1999 |
| JP | 2002-107698 A | 4/2002 |
| JP | 2002-326012 A | 11/2002 |
| JP | 2002-372748 A | 12/2002 |
| JP | 2004-109731 A | 4/2004 |
| JP | 2007-240646 A | 9/2007 |
| JP | 2007-294655 A | 11/2007 |
| JP | 2009-086271 A | 4/2009 |
| JP | 2010-107751 A | 5/2010 |
| JP | 2011-012820 A | 1/2011 |
| JP | 2011-036768 A | 2/2011 |
| JP | 2011-215457 A | 10/2011 |
| JP | 2014-087797 A | 5/2014 |
| JP | 2018-097312 A | 6/2018 |
| JP | 2019-117332 A | 7/2019 |

* cited by examiner

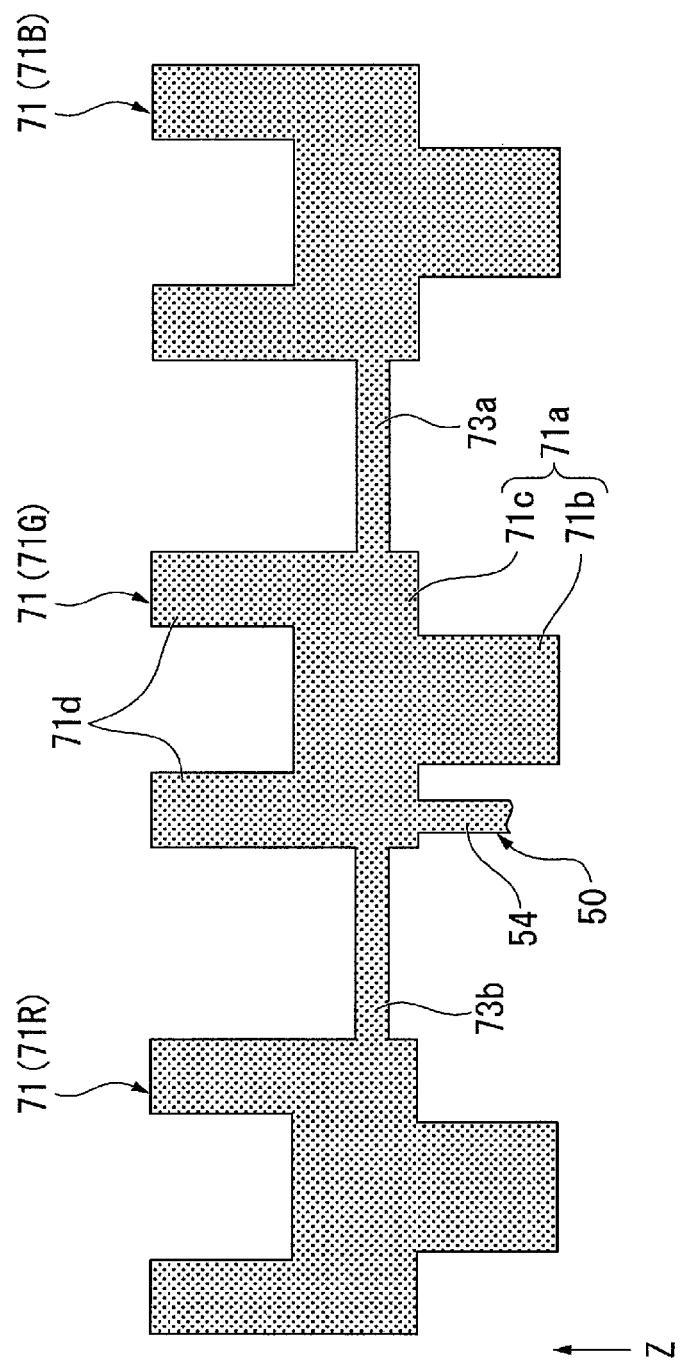

PROJECTOR INCLUDING COOLING TARGET

The present application is based on, and claims priority from JP Application Serial Number 2019-105946, filed Jun. 6, 2019, the disclosure of which is hereby incorporated by reference herein in its entirety.

BACKGROUND

1. Technical Field

The present disclosure relates to a projector.

2. Related Art

As a unit that cools a projector, there have been proposed cooling units, for example, an air-based cooling unit shown in JP-A-2002-107698 using an air blower and a liquid-based cooling unit shown in JP-A-2007-294655 using a pump that delivers a refrigerant liquid and a pipe through which the refrigerant liquid passes.

In recent years, an increase in luminance of light outputted from a projector and other factors increase the amount of heat generated by a cooling target to be cooled by a cooling unit, and the cooling performance of the cooling unit is required to be improved. To improve the cooling performance of the cooling unit described above based, for example, on air or liquid, however, there are problems of an increase in the size of the cooling unit and in turn an increase in the size of the projector. Further, in the case of the air-based cooling, there is also a problem of an increase in noise produced by the air blower.

SUMMARY

An aspect of a projector according to the present disclosure is directed to a projector including a cooling target, the projector including a light source configured to emit light, a light modulator configured to modulate the light emitted from the light source in accordance with an image signal, a projection optical apparatus configured to project the light modulated by the light modulator, and a cooler configured to cool the cooling target based on transformation of a refrigerant into a gas. The cooler includes a refrigerant generator configured to generate the refrigerant, a refrigerant sender configured to send the generated refrigerant toward the cooling target, and a cooling air blower configured to deliver air to the cooling target. The cooling target includes a cooling target main body and a cooled part which is thermally coupled to the cooling target main body and to which the refrigerant is sent from the refrigerant sender. The cooled part is disposed on a downstream of the cooling target main body in a flowing direction of the air delivered from the cooling air blower to the cooling target.

The projector may further include a light modulation unit including the light modulator and a holding frame holding the light modulator. The holding frame may include a frame main body holding the light modulator and an extending part extending from the frame main body. The light modulation unit may be the cooling target. The light modulator may be the cooling target main body. The extending part may be the cooled part.

The holding frame may be made of metal.

A material of the holding frame may contain aluminum.

A thermal conductivity of the holding frame may be higher than a thermal conductivity of the refrigerant sender.

The cooled part may be disposed above the cooling target main body in a vertical direction.

The projector may further include a refrigerant holder holding the refrigerant, and the refrigerant holder may be provided at the cooled part.

The refrigerant holder may be attached to a surface of the cooled part and may be formed of a porous member, and at least part of the refrigerant holder may be exposed when viewed from a refrigerant holder side along a overlapping direction in which the refrigerant holder and the cooled part overlap.

The projector may further include a fixing member fixing the refrigerant holder. The fixing member may fix the refrigerant holder in such a way that the fixing member and the cooled part sandwich the refrigerant holder in the overlapping direction. At least part of the refrigerant holder may be exposed when viewed from a fixing member side along the overlapping direction.

BRIEF DESCRIPTION OF THE DRAWINGS

FIG. 7 shows refrigerant holders in the present embodiment.

DESCRIPTION OF EXEMPLARY EMBODIMENTS

A projector according to an embodiment of the present disclosure will be described below with reference to the drawings. The scope of the present disclosure is not limited to the following embodiment and can be arbitrarily changed within the scope of the technical idea of the present disclosure. In the following drawings, for clarity of each configuration, the scale, the number, and other factors of the structure of the configuration differ from the scale, the number, and the other factors of the actual structure of the configuration in some cases.

Figure 1:
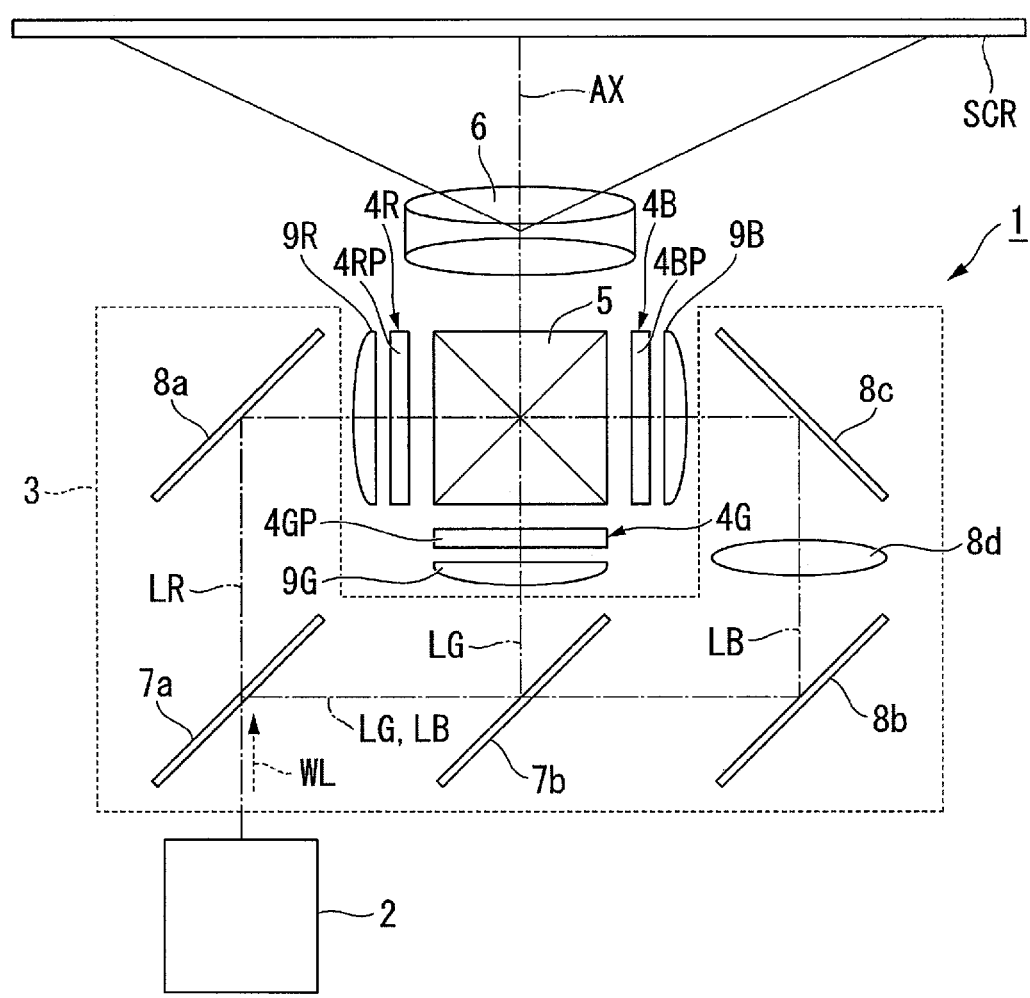
FIG. 1 is a schematic configuration diagram showing a projector according to an embodiment of the present disclosure.
Figure 2:
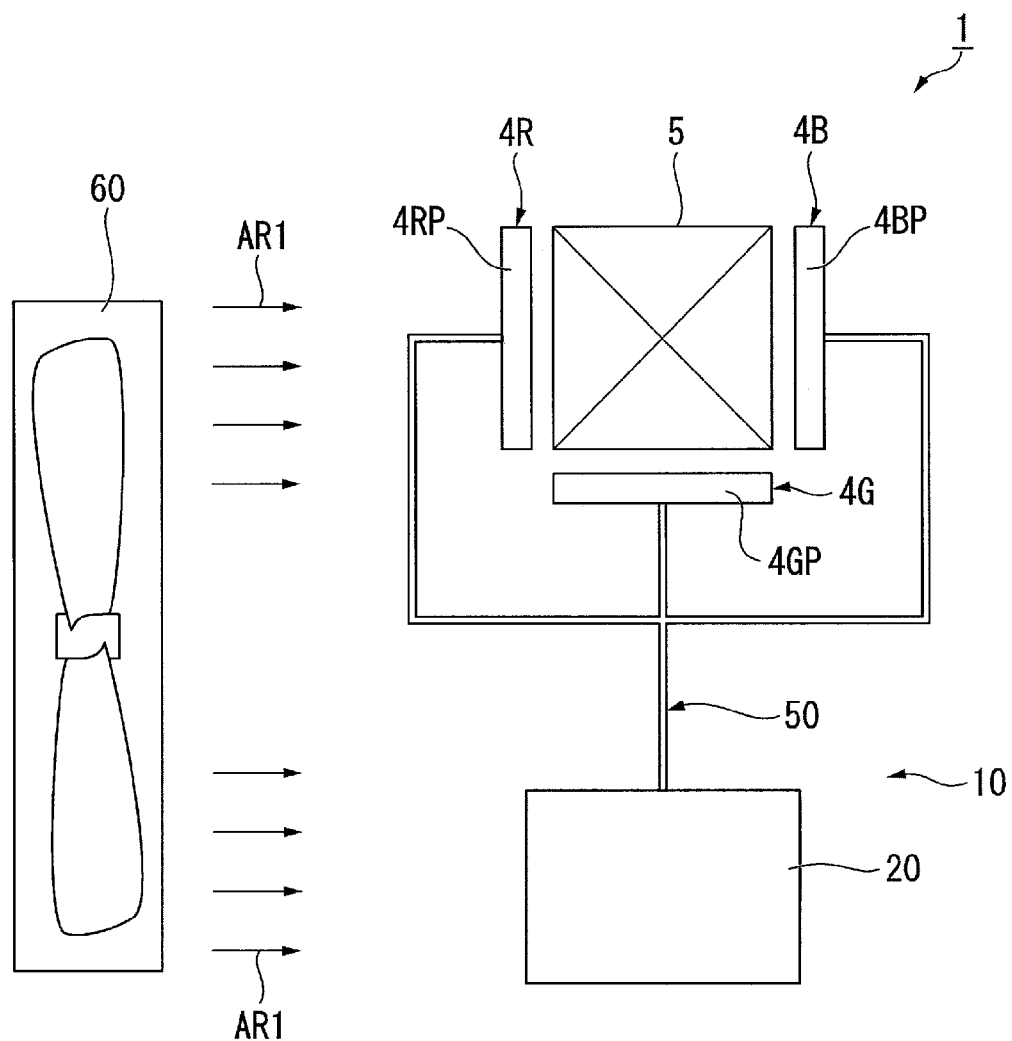
FIG. 2 is a diagrammatic view showing part of the projector according to the present embodiment.

FIG. 1 is a schematic configuration diagram showing a projector 1 according to the present embodiment. FIG. 2 is a diagrammatic view showing part of the projector 1 according to the present embodiment. The projector 1 includes a light source apparatus 2, a color separation system 3, a light modulation unit 4R, a light modulation unit 4G, a light modulation unit 4B, a light combining system 5, and a projection optical apparatus 6, as shown in FIG. 1. The light modulation unit 4R includes a light modulator 4RP. The light modulation unit 4G includes a light modulator 4GP. The light modulation unit 4B includes a light modulator 4BP.

The light source apparatus 2 outputs illumination light WL, which is so adjusted to have a substantially uniform illuminance distribution, toward the color separation system 3. The light source apparatus 2 includes, for example, a semiconductor laser as a light source. The color separation system 3 separates the illumination light WL from the light source apparatus 2 into red light LR, green light LG, and blue light LB. The color separation system 3 includes a first dichroic mirror 7a, a second dichroic mirror 7b, a first reflection mirror 8a, a second reflection mirror 8b, a third reflection mirror 8c, and a relay lens 8d.

The first dichroic mirror 7a separates the illumination light WL outputted from the light source apparatus 2 into the red light LR and light containing the green light LG and the blue light LB mixed with each other. The first dichroic mirror 7a is so characterized as to transmit the red light LR and reflect the green light LG and the blue light LB. The second dichroic mirror 7b separates the light containing the green light LG and the blue light LB mixed with each other into the green light LG and the blue light LB. The second dichroic mirror 7b is so characterized as to reflect the green light LG and transmit the blue light LB.

The first reflection mirror 8a is disposed in the optical path of the red light LR and reflects the red light LR having passed through the first dichroic mirror 7a toward the light modulator 4RP. The second reflection mirror 8b and the third reflection mirror 8c are disposed in the optical path of the blue light LB and guide the blue light LB having passed through the second dichroic mirror 7b to the light modulator 4BP.

The light modulators 4RP, 4GP, and 4BP are each formed of a liquid crystal panel. The light modulator 4RP modulates the red light LR out of the light outputted from the light source apparatus 2 in accordance with an image signal. The light modulator 4GP modulates the green light LG out of the light outputted from the light source apparatus 2 in accordance with an image signal. The light modulator 4BP modulates the blue light LB out of the light outputted from the light source apparatus 2 in accordance with an image signal. The light modulators 4RP, 4GP, and 4BP thus form image light fluxes corresponding to the respective color light fluxes. Although not shown, polarizers are disposed on the light incident side and the light exiting side of each of the light modulators 4RP, 4GP, and 4BP.

A field lens 9R, which parallelizes the red light LR to be incident on the light modulator 4RP, is disposed on the light incident side of the light modulator 4RP. A field lens 9G, which parallelizes the green light LG to be incident on the light modulator 4GP, is disposed on the light incident side of the light modulator 4GP. A field lens 9B, which parallelizes the blue light LB to be incident on the light modulator 4BP, is disposed on the light incident side of the light modulator 4BP.

The light combining system 5 is formed of a cross dichroic prism having a substantially cubic shape. The light combining system 5 combines the color image light fluxes from the light modulators 4RP, 4GP, and 4BP with one another. The light combining system 5 outputs the combined image light toward the projection optical apparatus 6. The projection optical apparatus 6 is formed of a projection lens group. The projection optical apparatus 6 enlarges the combined image light from the light combining system 5, that is, the light fluxes modulated by the light modulators 4RP, 4GP, and 4BP and projects the enlarged image light, that is, the enlarged modulated light fluxes toward a screen SCR. An enlarged color image (video) is thus displayed on the screen SCR.

The projector 1 further includes a cooler 10, as shown in FIG. 2. The cooler 10, in which a refrigerant W is transformed into a gas, cools a cooling target provided in the projector 1. In the present embodiment, the refrigerant W is, for example, liquid water. In the following description, the transformation of the refrigerant W into a gas is therefore simply called vaporization in some cases. In the present embodiment, the cooling target includes the light modulation units 4R, 4G, and 4B. That is, in the present embodiment, the cooling target includes the light modulators 4RP, 4GP, and 4BP. In the present embodiment, the light modulators 4RP, 4GP, and 4BP form a cooling target main body.

The cooler 10 includes a refrigerant generator 20 and a refrigerant sender 50. The refrigerant generator 20 is a portion that generates the refrigerant W. The refrigerant sender 50 is a portion that sends the generated refrigerant W toward the cooling target. The refrigerant W delivered by the refrigerant sender 50 to the cooling target, that is, the light modulation units 4R, 4G, and 4B in the present embodiment vaporizes so as to be capable of drawing heat from the cooling target. The cooler 10 can thus cool the cooling target. The refrigerant generator 20 and the refrigerant sender 50 will be described below in detail.

Figure 3:
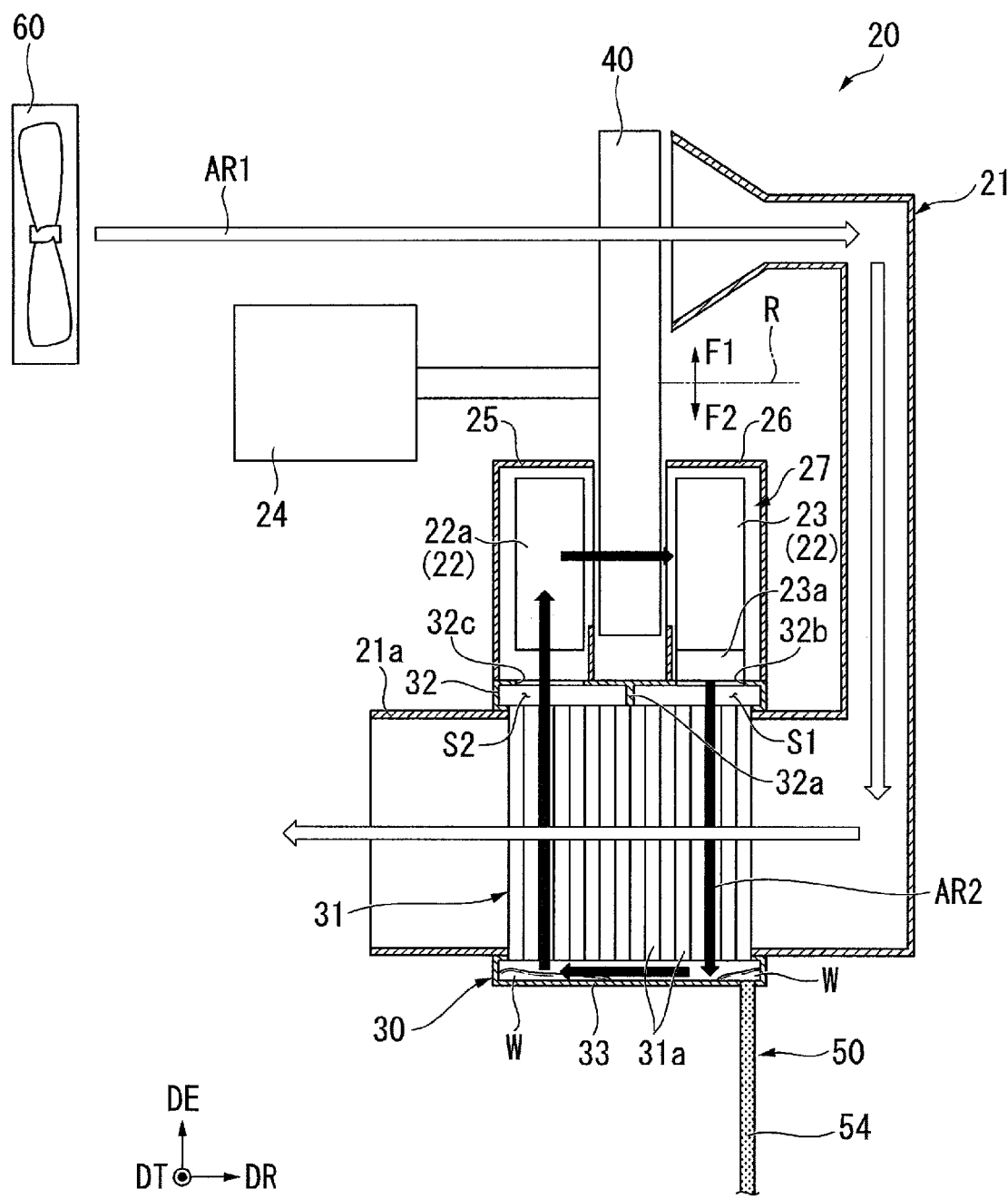
FIG. 3 is a schematic configuration diagram diagrammatically showing a refrigerant generator in the present embodiment.

FIG. 3 is a schematic configuration diagram diagrammatically showing the refrigerant generator 20 in the present embodiment. The refrigerant generator 20 includes a moisture absorbing/discharging member 40, a motor (driver) 24, a first air blower (cooling air blower) 60, a heat exchanger 30, a circulation duct 25, a circulation duct 26, a heater 22, a second air blower 23, and a cooling duct 21, as shown in FIG. 3.

Figure 4:
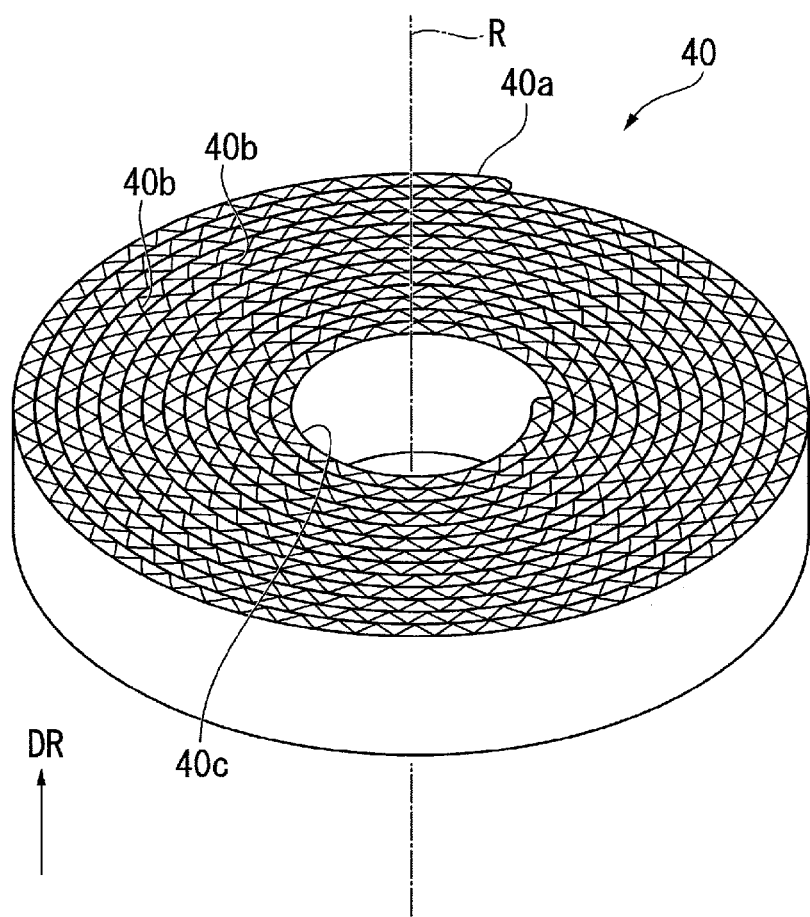
FIG. 4 is a perspective view showing a moisture absorbing/discharging member in the present embodiment.

FIG. 4 is a perspective view showing the moisture absorbing/discharging member 40. The moisture absorbing/discharging member 40 has a flat cylindrical shape around an axis of rotation R, as shown in FIG. 4. A central hole 40c around the axis of rotation R is formed at the center of the moisture absorbing/discharging member 40. The central hole 40c passes through the moisture absorbing/discharging member 40 in the axial direction of the axis of rotation R. The moisture absorbing/discharging member 40 rotates around the axis of rotation R. In the following description, the axial direction of the axis of rotation R is called a "rotational axis direction DR" and drawn as appropriate in the form of an axis DR in the drawings.

The moisture absorbing/discharging member 40 has an innumerable number of through holes 40b, which pass through the moisture absorbing/discharging member 40 in the rotational axis direction DR. The moisture absorbing/discharging member 40 is a porous member. The moisture absorbing/discharging member 40 absorbs and discharges moisture. In the present embodiment, the moisture absorbing/discharging member 40 is formed, for example, by winding a band-shaped member 40a having the through holes 40b around the axis of rotation R and applying a substance that absorbs and discharges moisture onto a surface of the wound band-shaped member 40a that is the surface exposed to the ambient environment. A surface of the wound band-shaped member 40a that is the surface exposed to the ambient environment includes the outer surface of the moisture absorbing/discharging member 40, the inner circumferential surface of the central hole 40c, and the inner surface of each of the through holes 40b. The moisture absorbing/discharging member 40 may instead be entirely made of a substance that absorbs and discharges moisture. Examples of the substance that absorbs and discharges moisture may include zeolite and silica gel.

The output shaft of the motor 24 shown in FIG. 3 is inserted into the central hole 40c of the moisture absorbing/discharging member 40 and fixed thereto. The motor 24 rotates the moisture absorbing/discharging member 40 around the axis of rotation R. The rotational speed of the moisture absorbing/discharging member 40 rotated by the motor 24 is, for example, approximately greater than or equal to 0.2 rpm but smaller than or equal to 5 rpm.

The first air blower 60 is, for example, an intake fan that takes outside air into the projector 1. The first air blower 60 delivers air AR1 to a portion of the moisture absorbing/discharging member 40 that is the portion located in a first region F1. The first region F1 is a region on one side of the axis of rotation R in the direction perpendicular to the axis of rotation R. On the other hand, the region on the other side of the axis of rotation R in the direction perpendicular to the axis of rotation R, that is, the region opposite the first region F1 with respect to the axis of rotation R is a second region F2. The first region F1 is a region above the axis of rotation R in FIG. 3. The second region F2 is a region below the axis of rotation R in FIG. 3.

The first air blower 60 delivers the air AR1 also to the light modulation units 4R, 4G, and 4B, which form the cooling target, as shown in FIG. 2. That is, in the present embodiment, the first air blower 60 is a cooling air blower that delivers the air AR1 to the cooling target. The first air blower 60 is not limited to a specific apparatus and may be any apparatus capable of delivering the air AR1, for example, an axial fan and a centrifugal fan.

Figure 5:
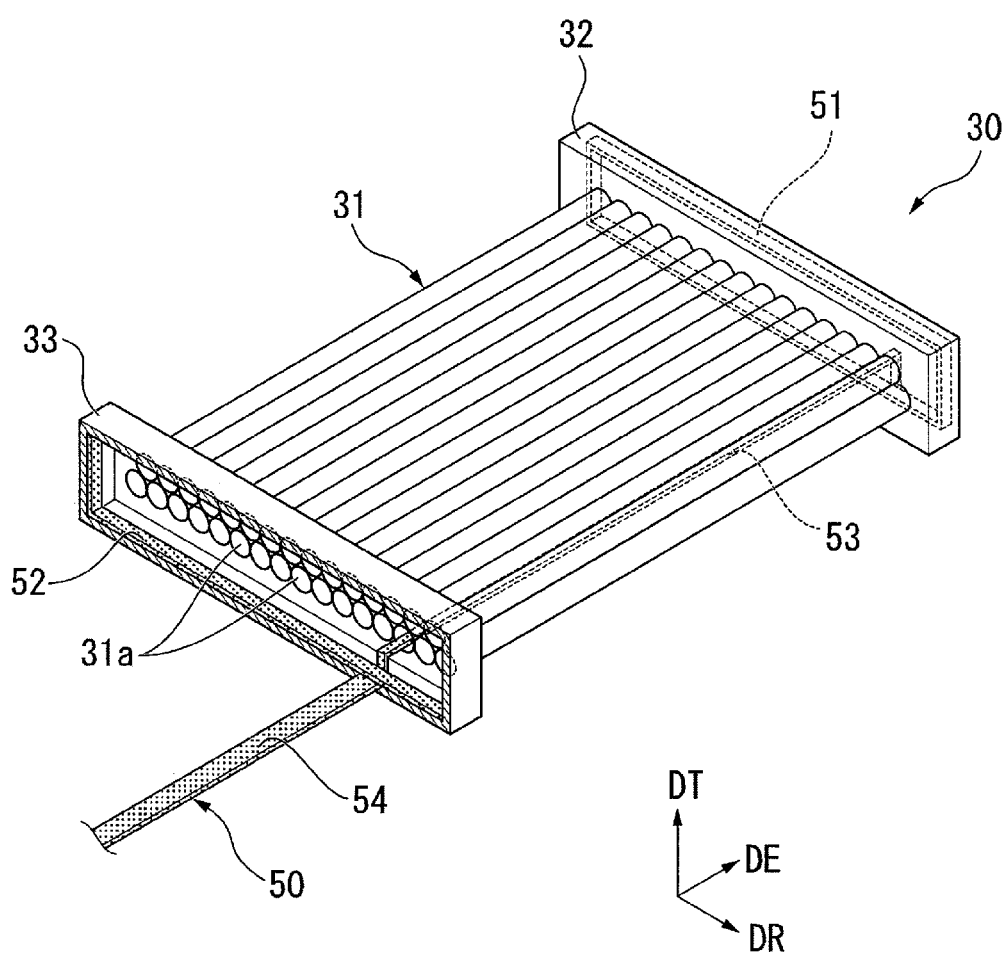
FIG. 5 is a partial cross-sectional perspective view showing a heat exchanger in the present embodiment.

The heat exchanger 30 is a portion that generates the refrigerant W. FIG. 5 is a partial cross-sectional perspective view showing the heat exchanger 30. The heat exchanger 30 includes a flow channel 31, a first lid 32, and a second lid 33, as shown in FIG. 5.

The flow channel 31 includes a plurality of tubular pipes 31a extending in one direction. In the present embodiment, the one direction in which the pipes 31a extend is, for example, perpendicular to the rotational axis direction DR. The pipes 31a are each open at the opposite ends thereof in the one direction in which the pipe 31a extends. The pipes 31a each have, for example, a circular cross-sectional shape perpendicular to the one direction in which the pipe 31a extends. In the following description, the one direction in which the pipes 31a extend is called an "extension direction DE" and drawn as appropriate in the form of an axis DE in the drawings. The first region F1 and the second region F2 described above are separate with respect to the axis of rotation R from each other in the extension direction DE perpendicular to the rotational axis direction DR.

In the present embodiment, the flow channel 31 is formed by layering a plurality of layers, which are each formed of a plurality of pipes 31a arranged in the rotational axis direction DR, on each other in the direction perpendicular both to the rotational axis direction DR and the extension direction DE. In the following description, the direction perpendicular both to the rotational axis direction DR and the extension direction DE is called a "thickness direction DT" and drawn as appropriate in the form of an axis DT in the drawings. In the present embodiment, the dimension of the flow channel 31 in the thickness direction DT is, for example, smaller than the dimension of the flow channel 31 in the rotational axis direction DR or is the smallest of the dimensions of the flow channel 31 in the directions perpendicular to the extension direction DE.

The first lid 32 is coupled to an end of the flow channel 31 that is the end on one side in the extension direction DE (+DE side). The first lid 32 has the shape of a rectangular parallelepiped box elongated in the rotational axis direction DR. One end of each of the pipes 31a in the extension direction DE is open in the first lid 32. A partition 32a is provided in the first lid 32, as shown in FIG. 3. The partition 32a partitions the interior of the first lid 32 into a first space S1 and a second space S2 disposed side by side in the rotational axis direction DR. In FIG. 3, the first space S1 is located on the right of the second space S2 (+DR side).

A communication hole 32b, which allows the first space S1 to be continuous with the interior of the circulation duct 26, is formed in the first lid 32. A communication hole 32c, which allows the second space S2 to be continuous with the interior of the circulation duct 25, is formed in the first lid 32.

The second lid 33 is coupled to an end of the flow channel 31 that is the end on the other side in the extension direction DE (−DE side), that is, the end opposite the end to which the first lid 32 is coupled to the flow channel 31. The second lid 33 has the shape of a rectangular parallelepiped box elongated in the rotational axis direction DR, as shown in FIG. 5. The other end of each of the pipes 31a in the extension direction DE is open in the second lid 33. The interior of the second lid 33 is not partitioned, unlike in the first lid 32. The interior of the second lid 33 is continuous with the first space S1 and the second space S2 in the first lid 32 via the interior of the pipes 31a of the flow channel 31. The second lid 33 is coupled to the refrigerant sender 50. The heat exchanger 30 is thus coupled to the refrigerant sender 50. In FIG. 5, a wall of the second lid 33 that is the wall located on the other side in the extension direction DE is omitted.

The circulation duct 26 is a duct disposed on one side of the moisture absorbing/discharging member 40 in the rotational axis direction DR (+DR side), as shown in FIG. 3. The circulation duct 26 has an inlet that is located on the other side in the rotational axis direction DR (−DR side) and is open toward a portion of the moisture absorbing/discharging member 40 that is the portion located in the second region F2. The circulation duct 26 has an outlet continuous with the communication hole 32b in the first lid 32.

The circulation duct 25 is a duct disposed on the other side of the moisture absorbing/discharging member 40 in the rotational axis direction DR (−DR side). The circulation duct 25 has an outlet that is located on the one side in the rotational axis direction DR (+DR side) and is open toward a portion of the moisture absorbing/discharging member 40 that is the portion located in the second region F2. The circulation duct 25 has an inlet continuous with the communication hole 32c in the first lid 32.

The heater 22 includes a heating main body 22a. The heating main body 22a is disposed in the circulation duct 25. The heating main body 22a is disposed on the other side, in the rotational axis direction DR (−DR side), of a portion of the moisture absorbing/discharging member 40 that is the portion located in the second region F2. The heating main body 22a is, for example, an electric heater. The heating main body 22a heats the atmosphere (air) in the circulation duct 25. In the present embodiment, the heater 22 includes the second air blower 23.

The second air blower 23 is disposed in the circulation duct 26. The second air blower 23 is disposed on the one side, in the rotational axis direction DR (+DR side), of a portion of the moisture absorbing/discharging member 40 that is the portion located in the second region F2. The second air blower 23 is, for example, a centrifugal fan. The second air blower 23 discharges air sucked from the other side in the rotational axis direction DR (−DR side) via an exhaust port 23a toward the other side in the extension direction DE (−DE side). The exhaust port 23a is open toward the communication hole 32b in the first lid 32. The second air blower 23 delivers the air into the first space S1 via the communication hole 32b.

The air discharged from the second air blower 23 into the first space S1 is the air having been sucked from the other side of the second air blower 23 in the rotational axis direction DR (−DR side) via the inlet of the circulation duct and having passed through a portion of the moisture absorbing/discharging member 40 that is the portion located in the second region F2. That is, the second air blower 23 causes the air to pass through a portion of the moisture absorbing/discharging member 40 that is the portion located in the second region F2, which differs from the first region F1, and delivers the air to the heat exchanger 30. In the present embodiment, the air before passing through a portion of the moisture absorbing/discharging member 40 that is the portion located in the second region F2 has flowed through the interior of the circulation duct 25. The heating main body 22a therefore heats the air before passing through a portion of the moisture absorbing/discharging member 40 that is the portion located in the second region F2.

As described above, in the present embodiment, the heater 22 heats a portion of the moisture absorbing/discharging member 40 that is the portion located in the second region F2 with the aid of the second air blower 23, which delivers the air heated by the heating main body 22a to a portion of the moisture absorbing/discharging member 40 that is the portion located in the second region F2. The second air blower 23 thus delivers air that passes through a portion of the moisture absorbing/discharging member 40 that is the portion heated by the heater 22 and air around the heated portion to the heat exchanger 30.

The air having flowed from the second air blower 23 into the heat exchanger 30 via the first space S1 passes through the pipes 31a continuous with the first space S1 out of the plurality of pipes 31a and flows into the second lid 33. The air having flowed into the second lid 33 passes through the pipes 31a continuous with the second space S2 out of the plurality of pipes 31a, flows into the second space S2, and flows into the circulation duct 25 via the communication hole 32c. The air having flowed into the circulation duct 25 is heated by the heating main body 22a, passes through a portion of the moisture absorbing/discharging member 40 that is the portion located in the second region F2 again, flows into the second circulation duct 26, and is sucked by the second air blower 23.

As described above, in the present embodiment, the refrigerant generator 20 has a circulation path 27, through which the air discharged from the second air blower 23 circulates. The circulation path 27 is formed of at least the circulation ducts 25 and 26 and the heat exchanger 30. The circulation path 27 passes through the heating main body 22a, the moisture absorbing/discharging member 40, and the heat exchanger 30. The circulation path 27 is substantially sealed although small gaps are provided between the moisture absorbing/discharging member 40 and the circulation ducts 25, 26, and entry of air outside the circulation path 27 into the circulation path 27 is therefore suppressed. In the following description, the air discharged from the second air blower 23 and circulating through the circulation path 27 is called air AR2.

The cooling duct 21 is a duct having an inlet disposed on the one side, in the rotational axis direction DR (+DR side), of a portion of the moisture absorbing/discharging member 40 that is the portion located in the first region F1. Air flowing into the cooling duct 21 is the air AR1 having been discharged from the first air blower 60 and having passed through a portion of the moisture absorbing/discharging member 40 that is the portion located in the first region F1. The cooling duct 21 extends from a region on the one side of a portion of the moisture absorbing/discharging member 40 that is the portion located in the first region F1 toward the heat exchanger 30.

The cooling duct 21 includes a cooling passage 21a, which extends in the rotational axis direction DR. The flow channel 31 of the heat exchanger 30 is so disposed in the cooling passage 21a as to pass thereacross in the extension direction DE. The flow channel 31 is thus disposed in the cooling passage 21a. The air AR1 passing through the cooling passage 21a is sprayed onto the outer surface of the flow channel 31 and passes by the flow channel 31 in the rotational axis direction DR. The flow channel 31 is thus cooled by the air AR1. That is, the heat exchanger 30 is cooled by the air AR1 having been discharged from the first air blower 60 and having passed through the moisture absorbing/discharging member 40. In FIG. 3, the air AR1 in the cooling passage 21a passes by the flow channel 31 from right to left. The cooling passage 21a has an open end facing the other side in the rotational axis direction DR (−DR side). The opening of the cooling passage 21a is, for example, an outlet of the cooling duct 21.

When the air AR1 is delivered from the first air blower 60 to a portion of the moisture absorbing/discharging member 40 that is the portion located in the first region F1, water vapor contained in the air AR1 is absorbed by a portion of the moisture absorbing/discharging member 40 that is the portion located in the first region F1. A portion of the moisture absorbing/discharging member 40 that is the portion having absorbed the water vapor moves from the first region F1 to the second region F2 when the motor 24 rotates the moisture absorbing/discharging member 40. The air AR2 heated by the heating main body 22a and therefore having a relatively high temperature then passes through a portion of the moisture absorbing/discharging member 40 that is the portion located in the second region F2. The moisture absorbed by the moisture absorbing/discharging member 40 thus vaporizes and is discharged into the air AR2.

The air AR2 having passed through the moisture absorbing/discharging member 40 and therefore containing the water vapor absorbed from the air AR1 is delivered by the second air blower 23 to the heat exchanger 30. The air AR2 having flowed via the first space S1 into the heat exchanger 30 flows through the flow channel 31. In more detail, the air AR2 flows through part of the pipes 31a of the flow channel 31. The flow channel 31 is externally cooled by the air AR1 flowing along the rotational axis direction DR through the cooling passage 21a of the cooling duct 21.

When the flow channel 31 is cooled, the air AR2 flowing through part of the pipes 31a and having a relatively high temperature is cooled, so that the water vapor contained in the air AR2 condenses into liquid water, that is, the refrigerant W. The heat exchanger 30, when cooled, thus generates the refrigerant W from the air AR2 having flowed into the heat exchanger 30.

In the present embodiment, the refrigerant sender 50 is formed of a porous member and sends the refrigerant W based on capillarity. Examples of the material of the refrigerant sender 50 may include polypropylene, cotton, and porous metal. The material of the refrigerant sender 50 preferably allows the refrigerant sender 50 to provide relatively large surface tension. The refrigerant sender 50 includes a first catcher 51, a second catcher 52, a third catcher 53, and a connector 54, as shown in FIG. 5.

The first catcher 51 is fixed to an edge portion of an inner surface of the first lid 32 that is the inner surface facing the one side in the extension direction DE (+DE side). The first catcher 51 has a thin-band-like shape and is formed in a rectangular-frame-like shape extending along the edge portion of the first lid 32. The second catcher 52 is fixed to an edge portion of an inner surface of the second lid 33 that is the inner surface facing the other side in the extension direction DE (−DE side). The second catcher 52 has a thin-band-like shape and is formed in a rectangular-frame-like shape extending along the edge portion of the second lid 33.

The third catcher 53 extends from the first catcher 51, passes through a pipe 31a, and reaches the second catcher 52, so that the third catcher 53 couples the first catcher 51 to the second catcher 52. The third catcher 53 has a thin-band-like shape extending in the extension direction DE. In the present embodiment, the third catcher 53 is disposed in one of the plurality of pipes 31a, as shown in FIG. 5, but not necessarily. The third catcher 53 may be provided in each of part of the plurality of pipes 31a or may be provided in each of the plurality of pipes 31a. When the third catcher 53 is provided in each of part of the plurality of pipes 31a, the third catchers 53 may be provided in two or more pipes 31a.

Figure 6:
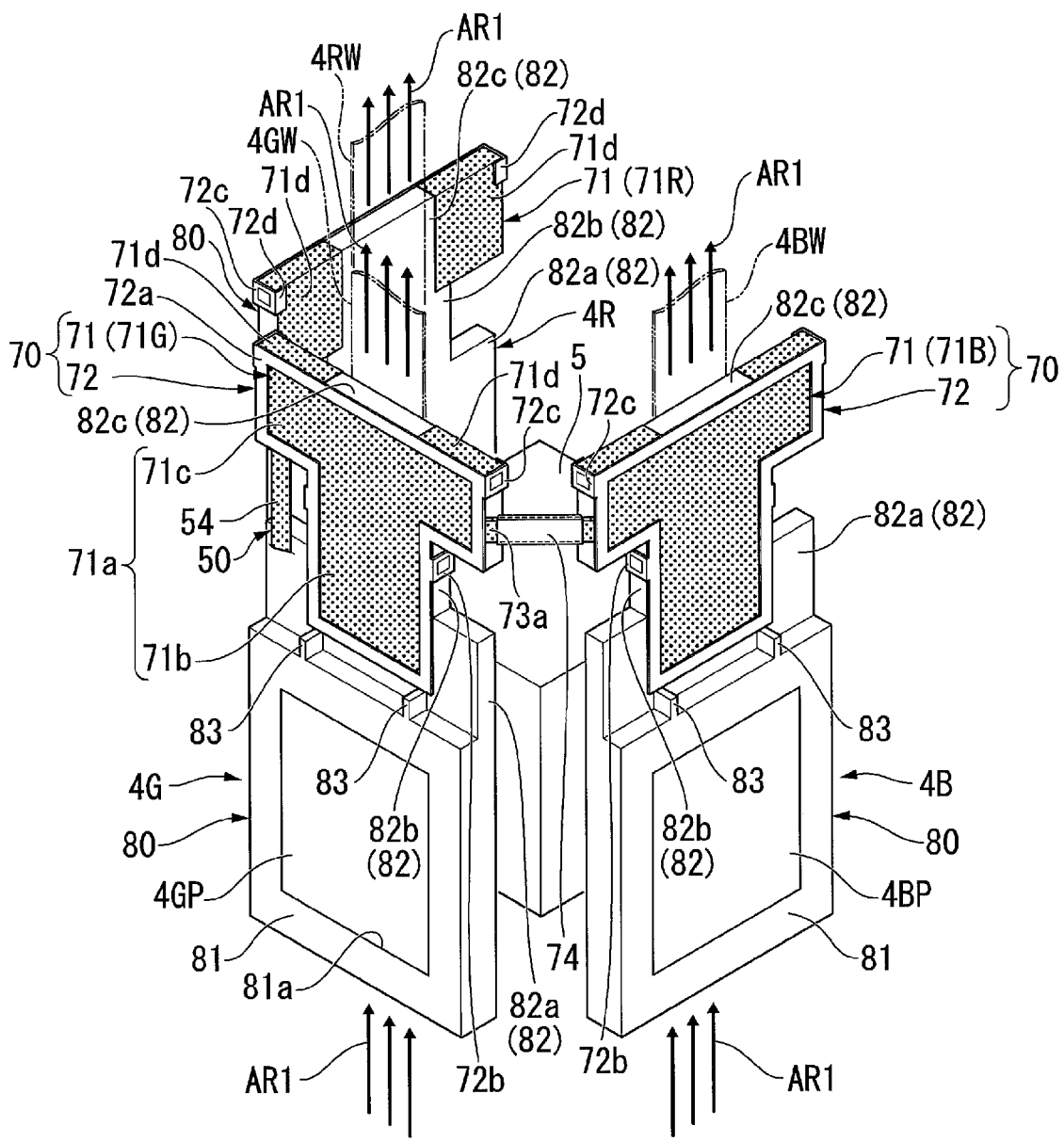
FIG. 6 is a perspective view showing light modulation units and a light combining system in the present embodiment.

The connector 54 is a portion that couples the refrigerant generator 20 to the cooling target. In the present embodiment, the connector 54 is coupled to the second catcher 52, extends from the interior of the second lid 33, passes through the wall of the second lid 33, and protrudes out of the second lid 33. The connector 54, which protrudes out of the second lid 33, extends to the light modulation unit 4G, which is part of the cooling target, as shown in FIG. 6. FIG. 6 is a perspective view showing the light modulation units 4R, 4G, and 4B and the light combining system 5. The connector 54 has a thin-band-like shape. The width of the connector 54 is, for example, greater than the width of the first catcher 51, the width of the second catcher 52, and the width of the third catcher 53.

The light modulation units 4R, 4G, and 4B, which form the cooling target in the present embodiment, will next be described in more detail. In the following description, an upward/downward direction Z, with the upper side thereof being the positive side and the lower side thereof being the negative side, is drawn as appropriate in the form of an axis Z in the drawings. The direction parallel to an optical axis AX of a projection lens of the projection optical apparatus 6 that is the projection lens closest to the light exiting side, that is, the direction parallel to the projection direction of the projection optical apparatus 6 is called an "optical axis direction X" and drawn as appropriate in the form of an axis X in the drawings. The optical axis direction X is perpendicular to the upward/downward direction Z. The direction perpendicular both to the optical axis direction X and the upward/downward direction Z is called a "width direction Y" and drawn as appropriate in the form of an axis Y in the drawings.

The upward/downward direction Z and the upper and lower sides thereof are merely names for describing the relative positional relationship among the portions of the projector, and the actual arrangement and other factors of the portions may differ from the arrangement and other factors indicated by the names. The present embodiment will be described with reference to the case where the upward/downward direction Z coincides with the vertical direction.

The light modulation units 4R, 4G, and 4B, which form the cooling target, are so disposed as to surround the light combining system 5, as shown in FIG. 6. The light modulation units 4R and 4B are so disposed on the opposite sides of the light combining system 5 as to sandwich the light combining system 5 in the width direction Y. The light modulation units 4R and 4B are disposed symmetrically with respect to the width direction Y. The light modulation unit 4G is disposed on the light incident side of the light combining system 5 in the optical axis direction X (−X side). The attitude of the light modulation unit 4G is the attitude of the light modulation unit 4R but rotated counterclockwise by 90° when viewed from the above.

In the light modulation unit 4R, the direction of the light passing through the light modulator 4RP coincides with the width direction Y. In the light modulation unit 4R, the positive side (+Y side) in the width direction Y is the light incident side of the light modulator 4RP that is the side on which the light is incident, and the negative side (−Y side) in the width direction Y is the light exiting side of the light modulator 4RP that is the side via which the light exits.

In the light modulation unit 4G, the direction of the light passing through the light modulator 4GP coincides with the optical axis direction X. In the light modulation unit 4G, the negative side (−X side) in the optical axis direction X is the light incident side of the light modulator 4GP that is the side on which the light is incident, and the positive side (+X side) in the optical axis direction X is the light exiting side of the light modulator 4GP that is the side via which the light exits.

In the light modulation unit 4B, the direction of the light passing through the light modulator 4BP coincides with the width direction Y. In the light modulation unit 4B, the negative side (−Y side) in the width direction Y is the light incident side of the light modulator 4BP that is the side on which the light is incident, and the positive side (+Y side) in the width direction Y is the light exiting side of the light modulator 4BP that is the side via which the light exits.

The light modulation units 4R, 4G, and 4B have the same shape although they are disposed in different positions and take different attitudes, and so do cooling facilitators 70, which will be described later and are provided in the light modulation units 4R, 4G, and 4B. Therefore, in the following description, only the light modulation unit 4G and the cooling facilitator 70 provided in the light modulation unit 4G will be representatively described below in some cases unless otherwise specified.

The light modulation units 4R, 4G, and 4B include holding frames 80, which hold the light modulators 4RP, 4GP, and 4BP. The holding frames 80 in the light modulation units 4R, 4G, and 4B have the same shape although they are disposed in different positions and take different attitudes in accordance with the positions where the light modulation units 4R, 4G, and 4B are disposed and the attitudes taken by the light modulation units 4R, 4G, and 4B.

The holding frame 80 provided in the light modulation unit 4G has a shape that is flat in the optical axis direction X, in which light passes through the light modulator 4GP, and elongated in the upward/downward direction Z. The holding frame 80 includes a frame main body 81, an extending part (cooled part) 82, and supports 83. The frame main body 81 is a portion that holds the light modulator 4GP. The frame main body 81 has a rectangular frame-like shape having a through hole 81a, which passes through the frame main body 81 in the optical axis direction X. The light modulator 4GP is fit into the through hole 81a. The light modulator 4GP is therefore held by the holding frame 80 with the outer circumferential portion of the light modulator 4GP held by the frame main body 81.

The extending part 82 is a portion extending from the frame main body 81. In the present embodiment, the extending part 82 extends upward from a portion of the upper end of the frame main body 81 that is the portion facing the light exiting side (+X side). The extending part 82 is disposed in a position shifted from the light modulator 4GP upward (toward +Z side) P in the vertical direction (axis-Z direction). The dimension of the extending part 82 in the optical axis direction X is smaller than the dimension of the frame main body 81 in the optical axis direction X. In the present embodiment, the extending part 82 is a cooled part to which the refrigerant W is sent from the refrigerant sender 50. That is, the light modulation units 4R, 4G, and 4B corresponding to the cooling target in the present embodiment include the light modulators 4RP, 4GP, and 4BP corresponding to the cooling target main body and the extending parts 82 corresponding to the cooled part.

The extending part 82 is thermally coupled to the light modulator 4GP, which is part of the cooling target main body, via the frame main body 81. In the present specification, a sentence "certain targets are thermally coupled to each other" may mean that the certain targets may be coupled to each other in a state in which heat is movable therebetween. That is, heat from the light modulator 4GP is movable to the extending part 82 via the frame main body 81.

The extending part 82 has a first part 82a, a second part 82b, and a third part 82c. The first part 82a, the second part 82b, and the third part 82c are concatenated with each other from below to above in the presented order. The first part 82a, the second part 82b, and the third part 82c each have the shape of a rectangular parallelepiped elongated in the width direction Y perpendicular both to the upward/downward direction Z and the optical axis direction X, along which the light passes through the light modulator 4GP.

The dimension of the first part 82a in the width direction Y is equal to the dimension of the frame main body 81 in the width direction Y. The dimension of the second part 82b in the width direction Y is smaller than the dimension of the first part 82a in the width direction Y. The dimension of the third part 82c in the width direction Y is greater than the dimensions of the first part 82a and the second part 82b in the width direction Y. The third part 82c protrudes beyond the second part 82b on the opposite sides in the width direction Y.

The supports 83 protrude from the first part 82a of the extending part 82 toward the light incident side (−X side). The supports 83 form a pair of supports 83 with a gap therebetween in the width direction Y. The lower ends of the supports 83 are coupled to the upper surface of the frame main body 81. The supports 83 support a refrigerant holder 71 and a fixing member 72, which will be described later, from below.

In the present embodiment, the holding frames 80 are made of metal. The material of the holding frames 80 contain, for example, aluminum. In the present embodiment, the thermal conductivity of the holding frames 80 is higher than the thermal conductivity of the refrigerant sender 50. The thermal conductivity of the holding frames 80 is, for example, greater than or equal to 80 [W/(m·K)]. The material of the holding frames 80 is not limited to a specific material and may contain copper or any other metal.

In the present embodiment, the projector 1 further includes cooling facilitators 70 provided in the light modulation units 4R, 4G, and 4B, which form the cooling target. The cooling facilitators 70 each include a refrigerant holder 71 and a fixing member 72. The refrigerant holder 71 is formed of a porous member that holds the refrigerant W. Examples of the material of the refrigerant holder 71 may include polypropylene, cotton, and porous metal. The material of the refrigerant holder 71 can, for example, be the same material of the refrigerant sender 50. The material of the refrigerant holder 71 preferably allows the refrigerant holder 71 to provide relatively large surface tension.

The refrigerant holders 71 are provided on surfaces of the extending parts 82, which form the cooled part. In the present embodiment, the refrigerant holders 71 are so provided as to extend along surfaces of the extending parts 82 that are the surfaces on the opposite sides in the direction in which the light passes through the light modulators 4RP, 4GP and 4BP. FIG. 7 shows the refrigerant holders 71. A refrigerant holder 71R provided in the light modulation unit 4R, a refrigerant holder 71G provided in the light modulation unit 4G, and a refrigerant holder 71B provided in the light modulation unit 4B have the same shape, as shown in FIG. 7. The shape of the refrigerant holder 71G will be representatively described below.

The refrigerant holder 71G includes a main body 71a and a pair of folded parts 71d. The main body 71a is provided on a surface of the extending part 82 that is the surface facing the light incident side (−X side). The main body 71a includes a narrow part 71b and a wide part 71c.

In the present embodiment, the narrow part 71b has a rectangular shape. The narrow part 71b is so provided as to extend along a surface of the first part 82a of the extending part 82 that is the surface facing the light incident side (−X side) and a surface of the second part 82b of the extending part 82 that is the surface facing the light incident side. The narrow part 71b covers a portion of the light-incident-side surface of the first part 82a that is a central portion in the width direction Y and the entire light incident side of the second part 82b.

In the present embodiment, the wide part 71c has a rectangular shape. The wide part 71c is continuous with the upper side of the narrow part 71b. The wide part 71c protrudes beyond the narrow part 71b on the opposite sides in the width direction Y. The wide part 71c is provided on the light-incident-side surface (−X-side surface) of the third part 82c of the extending part 82. The wide part 71c covers the entire light-incident-side surface of the third part 82c.

The pair of folded parts 71d are provided at portions of the upper end of the wide part 71c that are opposite end portions in the width direction Y. The pair of folded parts 71d extend via the upper side of the extending part 82 and are folded back toward the light exiting side (+X side). The pair of folded parts 71d are so provided as to extend along the upper surface of the third part 82c of the extending part 82 and the light-exiting-side surface of the third part 82c. The pair of folded parts 71d cover portions of the upper side surface of the third part 82c that are opposite end portions in the width direction Y and portions of the light-exiting-side surface of the third part 82c that are opposite end portions in the width direction Y.

Out of the refrigerant holders 71 provided in the light modulation units 4R, 4G, and 4B, the refrigerant holder 71G provided in the light modulation unit 4G is coupled to the refrigerant sender 50, as shown in FIG. 7. In more detail, the connector 54 of the refrigerant sender 50 is coupled to the lower end of the wide part 71c of the refrigerant holder 71G. On the other hand, the connector 54 is not coupled to the refrigerant holder 71B attached to the light modulation unit 4B or the refrigerant holder 71R attached to the light modulation unit 4R.

In the present embodiment, the linkage parts 73a and 73b are provided on the opposite sides of the refrigerant holder 71G attached to the light modulation unit 4G and link the refrigerant holder 71B attached to the light modulation unit 4B and the refrigerant holder 71R attached to the light modulation unit 4R to the refrigerant holder 71G. The linkage parts 73a and 73b are each formed of a porous member.

The linkage part 73a links the refrigerant holder 71G attached to the light modulation unit 4G to the refrigerant holder 71B attached to the light modulation unit 4B. In more detail, the linkage part 73a links the wide part 71c of the refrigerant holder 71G to the wide part 71c of the refrigerant holder 71B. The refrigerant holder 71B is thus coupled to the connector 54 of the refrigerant sender 50 via the refrigerant holder 71G. The linkage part 73a is provided with a coating 74, with which the linkage part 73a is coated, as shown in FIG. 6. The coating 74 is, for example, a film made of resin.

The linkage part 73b links the refrigerant holder 71G attached to the light modulation unit 4G to the refrigerant holder 71R attached to the light modulation unit 4R, as shown in FIG. 7. In more detail, the linkage part 73b links the wide part 71c of the refrigerant holder 71G to the wide part 71c of the refrigerant holder 71R. The refrigerant holder 71R is thus coupled to the connector 54 of the refrigerant sender 50 via the refrigerant holder 71G. Although not shown, the linkage part 73b is similarly provided with a coating 74, as is the linkage part 73a.

The fixing members 72 are members that fix the refrigerant holder 71, as shown in FIG. 6. The fixing members 72 provided in the light modulation units 4R, 4G, and 4B have the same shape, and the fixing member 72 that fixes the refrigerant holder 71G provided in the light modulation unit 4G will be therefore representatively described in the following description.

The fixing member 72 is a plate-shaped member. The fixing member 72 is made, for example, of metal. The fixing member 72 includes a frame part 72a and attachment parts 72b and 72c. The frame part 72a is located on the light incident side (−X side) of the main body 71a of the refrigerant holder 71. The frame part 72a covers an outer edge portion of the main body 71a. The frame part 72a has the same outer shape as that of the main body 71a.

The main body 71a and the frame part 72b of the refrigerant holder 71 are layered on the extending part 82 in the direction in which the light passes through the light modulation unit 4G (optical axis direction X). In the following description, the direction in which the main body 71a and the frame part 72a of the refrigerant holder 71 are layered on the extending part 82 is simply called a "layering direction." The fixing member 72 fixes the main body 71a of the refrigerant holder 71 in such a way that the frame part 72a and the extending part 82, which is the cooled part, sandwich the main body 71a in the layering direction (optical axis direction X).

In the present embodiment, at least part of the refrigerant holder 71 is exposed when viewed along the layering direction from the side facing the fixing member 72 (light incident side). In more detail, a portion of the main body 71a of the refrigerant holder 71 that is the portion inside the frame part 72a is exposed when viewed along the layering direction from the side facing the fixing member 72.

The attachment parts 72b are provided at portions of a lower portion of the frame part 72a that are opposite end portions in the width direction Y. The attachment parts 72c are provided at portions of an upper portion of the frame part 72a that are opposite end portions in the width direction Y. The attachment parts 72b and 72c protrude from the frame part 72a toward the light exiting side (+X side). The attachment parts 72b engage with protrusions provided at the side surfaces of the second part 82b of the holding frame 80. The attachment parts 72c engage with protrusions provided at the side surfaces of the third part 82c of the holding frame 80. The fixing member 72 is thus fixed to the holding frame 80. Front end portions of the attachment parts 72c are bent and form claw-shaped parts 72d, which press the pair of folded parts 71d from the light exiting side. FIG. 6 shows the claw-shaped parts 72d of the fixing member 72 provided in the light modulation unit 4R.

The light modulation unit 4R includes a wiring line 4RW electrically coupled to the light modulator 4RP. The light modulation unit 4G includes a wiring line 4GW electrically coupled to the light modulator 4GP. The light modulation unit 4B includes a wiring line 4BW electrically coupled to the light modulator 4BP. The wiring lines 4RW, 4GW, and 4BW are located on the light exiting side of the extending part 82, extend in the upward/downward direction Z, and are drawn upward beyond the extending part 82. The wiring lines 4RW, 4GW, and 4BW are so disposed as to face a surface of the light-exiting-side surface of the extending part 82 of the holding frames 80 that is the surface between the pair of folded parts 71d.

The air AR1 from the first air blower 60 is delivered from below to above to the light modulation units 4R, 4G, and 4B, which form the cooling target. The air AR1 delivered to the light modulation units 4R, 4G, and 4B travels via the frame main bodies 81 and the light modulators 4RP, 4GP and 4BP and is then delivered to the extending parts 82, the refrigerant holders 71, and the fixing members 72. That is, in the direction in which the air AR1 delivered from the first air blower 60 to the light modulation units 4R, 4G, and 4B flows, the extending parts 82, which form the cooled part, are disposed in positions downstream of the light modulators 4RP, 4GP and 4BP, which form the cooling target main body.

The refrigerant W generated by the refrigerant generator 20 is sent to the refrigerant holder 71G via the connector 54 of the refrigerant sender 50. The refrigerant W sent to the refrigerant holder 71G is sent to the refrigerant holder 71B via the linkage part 73a and to the refrigerant holder 71R via the linkage part 73b. The refrigerant W generated by the refrigerant generator 20 is thus sent to the three light modulation units 4R, 4G, and 4B. The refrigerant W sent to and held by the refrigerant holders 71 then vaporizes to cool the light modulation units 4R, 4G, and 4B, which form the cooling target. In more detail, the refrigerant W held by the refrigerant holders 71 vaporizes to cool the extending parts 82, which form the cooled part, so that the light modulators 4RP, 4GP, and 4BP, which are thermally coupled to the frame main bodies 81 and the extending parts 82 via the frame main bodies 81, are cooled. The cooler 10 can thus cool the light modulation units 4R, 4G, and 4B, which form the cooling target.

According to the present embodiment, the cooler 10 can cool the cooling target by sending the refrigerant W generated by the refrigerant generator 20 to the cooling target via the refrigerant sender 50 and using vaporization of the refrigerant W, which is an endothermic reaction, to draw heat from the cooling target. The cooling based on the vaporization of the refrigerant W can actively draw heat from the cooling target and therefore provides excellent cooling performance as compared with air cooling and liquid cooling, in which a cooling target is cooled based merely on heat transfer to a refrigerant. Therefore, to provide the same cooling performance as that provided by air cooling or liquid cooling, the overall size of the cooler 10 is readily reduced as compared with the size required by air cooling or liquid cooling.

Further, in the cooling based on the vaporization of the refrigerant W, the cooling performance can be improved by an increase in the surface area where the refrigerant W that vaporizes comes into contact with the cooling target. The increase in the cooling performance of the cooler 10 therefore causes no increase in noise produced by the cooler 10. The present embodiment therefore provides a projector 1 including a cooler 10 that excels in cooling performance, has a compact size, and excels in quietness.

According to the present embodiment, in which the refrigerant generator 20 can generate the refrigerant W, a user's convenience can be improved because the user does not need to replenish the refrigerant W. Further, since the refrigerant generator 20 can perform adjustment in such a way that it generates the refrigerant W by a necessary amount as required, there is no need for storage of the refrigerant W, for example, in a storage tank, whereby the weight of the projector 1 can be reduced.

According to the present embodiment, the moisture absorbing/discharging member 40 can absorb water vapor contained in the air AR1 delivered from the first air blower 60, and the moisture absorbed by the moisture absorbing/discharging member 40 can be discharged in the form of water vapor into the air AR2 delivered by the second air blower 23. The heat exchanger 30 then allows the moisture discharged in the form of water vapor into the air AR2 to condense into the refrigerant W. Therefore, according to the present embodiment, the refrigerant W can be generated from the atmosphere in the projector 1.

According to the present embodiment, the heat exchanger 30 is cooled by the air AR1 having been discharged from the first air blower 60 and having passed through the moisture absorbing/discharging member 40. No cooling section that cools the heat exchanger 30 therefore needs to be separately provided, whereby an increase in the number of parts of the projector 1 can be suppressed. Further, an increase in noise produced by the projector 1 can be suppressed as compared with a case where an air blower is separately provided as the cooling section that cools the heat exchanger 30.

According to the present embodiment, the first air blower 60 is the cooling air blower that delivers the air AR1 to the light modulation units 4R, 4G, and 4B, which form the cooling target. The air AR1 therefore causes the refrigerant W sent to the light modulation units 4R, 4G, and 4B to readily vaporize, whereby the light modulation units 4R, 4G, and 4B can be further cooled. Further, no cooling air blower that cools the cooling target needs to be provided separately from the first air blower 60, whereby an increase in the number of parts of the projector 1 can be suppressed, and an increase in noise produced by the projector 1 can be suppressed.

In the present embodiment, the first air blower 60, which is an intake fan that takes outside air into the projector 1, is used to facilitate the vaporization of the refrigerant W delivered to the cooling target, as described above. The same cooling performance as that provided when no cooler 10 is provided can therefore be provided even when the output of the first air blower 60 is lowered. The noise produced by the first air blower 60 can therefore be reduced by lowering the output of the first air blower 60, which is an intake fan, whereby the quietness of the projector 1 can be further improved.

When the refrigerant W delivered to the cooling target vaporizes, the refrigerant W having vaporized increases the humidity of the air around the cooling target to a relatively large value. The relatively high humidity air could therefore affect the cooling target and cause a problem. Specifically, when the cooling target is an optical element, the refrigerant W having vaporized at the cooling target could obstruct the progress of the light to be incident on the optical element or the light that exits out of the optical element. The reliability of the projector could thus lower.

In contrast, according to the present embodiment, in the flowing direction of the air AR1 delivered from the first air blower 60 to the light modulation units 4R, 4G, and 4B, which form the cooling target, the extending parts 82, which form the cooled part, to which the refrigerant W is sent, is disposed in positions downstream of the light modulators 4RP, 4GP, and 4BP, which form the cooling target main body. The flow of the air AR1 therefore causes the refrigerant W having vaporized at the extending parts 82 to flow away from the light modulators 4RP, 4GP, and 4BP, which form the cooling target main body. An increase in the humidity of the air around the light modulators 4RP, 4GP, and 4BP due to the refrigerant W having vaporized can thus be suppressed. The obstruction of the progress of the light to be incident on the light modulators 4RP, 4GP, and 4BP or the light that exits out of the light modulators 4RP, 4GP, and 4BP can therefore be suppressed. The present embodiment can thus suppress a problem with the cooling target main body due to the refrigerant W having vaporized, whereby the reliability of the projector 1 can be improved.

According to the present embodiment, in particular, since the light modulation units 4R, 4G, and 4B form the cooling target, and the light modulators 4RP, 4GP, and 4BP form the cooling target main body. Therefore, a problem with the light modulators 4RP, 4GP, and 4BP can be suppressed, and blur and other problems with a color image (color video image) outputted from the projector 1 can be suppressed.

The lower the temperature of the air AR1 delivered to the light modulators 4RP, 4GP, and 4BP, which form the cooling target main body, the easier the cooling of the light modulators 4RP, 4GP, and 4BP. In the present embodiment, the air AR1 is delivered to the light modulators 4RP, 4GP, and 4BP, which form the cooling target main body, before the air AR1 is delivered to the extending parts 82, which form the cooled part. The air AR1 having a relatively low temperature can thus be delivered to the light modulators 4RP, 4GP, and 4BP. The light modulators 4RP, 4GP, and 4BP, which form the cooling target main body, are thus more likely to be cooled.

The air AR1 delivered to the extending parts 82 is the air Ar1 having traveled via the light modulators 4RP, 4GP, and 4BP and therefore has a temperature increased by a value corresponding to the amount of heat absorbed from the light modulators 4RP, 4GP, and 4BP. Delivering the air AR1 having a relatively high temperature to the extending parts 82 can still sufficiently facilitate vaporization of the refrigerant W sent to the extending parts 82. The air AR1 having traveled via the light modulators 4RP, 4GP, and 4BP can therefore still, when delivered to the extending parts 82, cause the refrigerant W to vaporize and preferably cool the extending parts 82. Delivering the air AR1 to the light modulation units 4R, 4G, and 4B and the extending parts 82 in the presented order can therefore efficiently cool the light modulation units 4R, 4G, and 4B, which form the cooling target.

According to the present embodiment, the holding frames 80, which hold the light modulators 4RP, 4GP, and 4BP, which form the cooling target main body, are made of metal. The heat from the light modulators 4RP, 4GP, and 4BP is therefore likely to transfer to the holding frames 80. Cooling the extending parts 82, which form the cooled part, out of the holding frames 80 based on the vaporization of the refrigerant W can therefore more preferably cool the light modulators 4RP, 4GP, and 4BP, which form the cooling target main body.

According to the present embodiment, the material of the holding frames 80 contains aluminum. The holding frames 80 therefore tend to have relatively high thermal conductivity. The heat from the light modulators 4RP, 4GP, and 4BP is therefore likely to transfer to the holding frames 80. Cooling the extending parts 82, which form the cooled part, out of the holding frames 80 based on the vaporization of the refrigerant W can therefore more preferably cool the light modulators 4RP, 4GP, and 4BP, which form the cooling target main body.

According to the present embodiment, the thermal conductivity of the holding frames 80 is higher than the thermal conductivity of the refrigerant sender 50. The holding frames 80 therefore tend to have relatively high thermal conductivity. The heat from the light modulators 4RP, 4GP, and 4BP is therefore likely to transfer to the holding frames 80. Cooling the extending parts 82, which form the cooled part, out of the holding frames 80 based on the vaporization of the refrigerant W can therefore more preferably cool the light modulators 4RP, 4GP, and 4BP, which form the cooling target main body.

According to the present embodiment, the extending parts 82, which form the cooled part, are disposed vertically above the light modulators 4RP, 4GP, and 4BP, which form the cooling target main body. The refrigerant W having vaporized is likely to move upward in the vertical direction. Therefore, for example, even when the first air blower 60 is not in operation, the refrigerant W having vaporized at the extending parts 82 moves upward in the vertical direction, that is, in the direction away from the light modulators 4RP, 4GP, and 4BP. Therefore, even when the first air blower 60 is not in operation, movement of the refrigerant W having vaporized at the extending parts 82 to the region around the light modulators 4RP, 4GP, and 4BP can be suppressed, whereby malfunction of the light modulators 4RP, 4GP, and 4BP can be suppressed.

According to the present embodiment, the refrigerant holders 71, which hold the refrigerant W, are provided on the extending parts 82, which form the cooled part. The refrigerant holders 71 can therefore hold the refrigerant W sent to the extending parts 82 at the extending parts 82 until the refrigerant W vaporizes. The generated refrigerant W is therefore readily used with no waste, whereby the cooling performance of the cooler 10 can be further improved.

According to the present embodiment, the refrigerant holders 71 are attached to the surfaces of the extending parts 82, which form the cooled part, and the refrigerant holders 71 are each formed of a porous member. At least part of each of the refrigerant holders 71 is exposed when viewed along the layering direction from the side facing the refrigerant holder 71. The refrigerant W therefore readily vaporizes via the exposed portion of each of the refrigerant holders 71, whereby the cooling performance of the cooler 10 can be further improved. Further, the refrigerant holders 71, which are each formed of a porous member, readily uniformly distribute the refrigerant W across the surface of the cooled part, on which the refrigerant holders 71 are provided, based on capillarity, whereby the cooling target is readily further cooled.

For example, when the refrigerant holders 71 are fixed to the extending parts 82 with an adhesive, the pores in the refrigerant holders 71, which are each formed of a porous member, are closed in some cases with the adhesive absorbed by the refrigerant holders 71. The refrigerant holders 71 are therefore unlikely to absorb or hold the refrigerant W in some cases.

In contrast, according to the present embodiment, the fixing members 72 are so provided as to fix the refrigerant holders 71 in such a way that the fixing members 72 and the extending parts 82 sandwich the refrigerant holders 71. The refrigerant holders 71 can therefore be fixed to the extending parts 82 with use of no adhesive. The situation in which the refrigerant holders 71 are unlikely to hold the refrigerant W can therefore be suppressed. Further, in the present embodiment, the fixing members 72 are made of metal. The fixing members 72 therefore have relatively high thermal conductivity and are hence likely to be cooled. The air AR1 from the first air blower 60 and the vaporization of the refrigerant W therefore readily lower the temperature of the fixing members 72, whereby the cooled part, which is in contact with fixing members 72, is readily further cooled.

According to the present embodiment, the refrigerant holders 71 are provided in the plurality of light modulation units 4R, 4G, and 4B, and the linkage part 73a, which links the two refrigerant holders 71G and 71B to each other, the linkage part 73b, which links the two refrigerant holders 71G and 71R to each other, are provided. Coupling the refrigerant sender 50 to one of the refrigerant holders 71 therefore allows the refrigerant W to be sent to the other refrigerant holders 71. The routing of the refrigerant sender 50 in the projector 1 can therefore be simplified.

According to the present embodiment, the linkage parts 73a and 73b are provided with the respective coatings 74, with which the linkage parts 73a and 73b are coated. A situation in which the refrigerant W that moves along the linkage parts 73a and 73b vaporizes via the linkage parts 73a and 73b can therefore be suppressed. Therefore, a situation in which the refrigerant W vaporizes without contributing to the cooling of the light modulation units 4R, 4G, and 4B, which form the cooling target, can be suppressed, whereby waste of the generated refrigerant W can be suppressed.

In the present embodiment, the connector 54 may also be coated, as are the linkage parts 73a and 73b. The configuration described above can suppress vaporization of the refrigerant W being sent to the cooling target. Therefore, the refrigerant W can be efficiently sent to the cooling target, and waste of the generated refrigerant W can be further suppressed. The circumference of each of the connector 54 and the linkage parts 73a and 73b may instead be covered, for example, with a tube. A coating treatment that suppresses the vaporization may still instead be performed on the surface of each of the connector 54 and the linkage parts 73a and 73b.

Further, for example, in the refrigerant generator 20, when the humidity of the air AR2 delivered from the second air blower 23 to the heat exchanger 30 is relatively low, cooling the heat exchanger 30 is unlikely to allow generation of the refrigerant W in some cases. For example, when air or any other substance outside the projector 1 mixes with the air AR2 delivered to the heat exchanger 30, the humidity of the air AR2 lowers in some cases.

In contrast, according to the present embodiment, the refrigerant generator 20 has the circulation path 27, through which the air AR2 discharged from the second air blower 23 circulates. Substantially sealing the circulation path 27 can therefore suppress entry of air outside the projector 1 into the circulation path 27, whereby the humidity of the air AR2 delivered to the heat exchanger 30 can be readily maintained relatively high. Cooling the heat exchanger 30 therefore allows the refrigerant W to be preferably generated.

According to the present embodiment, the heater 22 includes the heating main body 22a, which heats the air before passing through a portion of the moisture absorbing/discharging member 40 that is the portion located in the second region F2, and the second air blower 23. The heater 22, in which the second air blower 23 delivers the air AR2 to the moisture absorbing/discharging member 40, can therefore heat a portion of the moisture absorbing/discharging member 40 that is the portion located in the second region F2. The heater 22 can therefore heat the moisture absorbing/discharging member 40 even in the configuration in which the heating main body 22a is located in a position separate from the moisture absorbing/discharging member 40. The heater 22 can therefore be configured with improved flexibility.

According to the present embodiment, the refrigerant generator 20 includes the motor 24, which rotates the moisture absorbing/discharging member 40. The moisture absorbing/discharging member 40 can therefore be stably rotated at a fixed speed. Therefore, a portion of the moisture absorbing/discharging member 40 that is the portion located in the first region F1 can preferably absorb water vapor from the air AR1, and a portion of the moisture absorbing/discharging member 40 that is the portion located in the second region F2 can preferably discharge moisture into the air AR2. The refrigerant W can therefore be efficiently generated.

According to the present embodiment, the refrigerant sender 50 sends the refrigerant W based on capillarity. No pump or any other power source for sending the refrigerant W therefore needs to be separately provided. An increase in the number of parts of the projector 1 can therefore be suppressed, whereby the size and weight of the projector 1 are each readily reduced by a greater amount.

According to the present embodiment, the refrigerant sender 50 includes the connector 54, which is formed of a porous member and couples the refrigerant generator 20 to the cooling target. The connector 54 can therefore absorb the refrigerant W and send the refrigerant W based on capillarity.

According to the present embodiment, the refrigerant sender 50 includes the second catcher 52 provided in the second lid 33. The second catcher 52 is coupled to the connector 54. The second catcher 52 can therefore absorb the refrigerant W accumulated in the second lid 33 and send the absorbed refrigerant W to the connector 54 based on capillarity. The generated refrigerant W is therefore readily delivered with no waste to the cooling target.

According to the present embodiment, the refrigerant sender 50 includes the first catcher 51, which is provided in the first lid 32, and the third catcher 53, which couples the first catcher 51 to the second catcher 52. The first catcher 51 can therefore absorb the refrigerant W having accumulated in the first lid 32 and send the absorbed refrigerant W to the second catcher 52 via the third catcher 53 based on capillarity. The refrigerant W having accumulated in the first lid 32 can therefore be sent from the second catcher 52 to the connector 54, which can then send the refrigerant W to the cooling target. The generated refrigerant W is therefore readily delivered with no waste to the cooling target.

According to the present embodiment, the third catcher 53 passes through a pipe 31a. The third catcher 53 can therefore absorb the refrigerant W having accumulated in the pipe 31a and send the absorbed refrigerant W to the cooling target via the second catcher 52 and the connector 54. The generated refrigerant W is therefore readily delivered with no waste to the cooling target.

According to the present embodiment, the width of the connector 54 is greater, for example, than the width of the first catcher 51, the width of the second catcher 52, and the width of the third catcher 53. The width of the connector 54 is therefore readily set at a relatively large value, whereby the amount of refrigerant W that can be sent by the connector 54 can be increased. The refrigerant sender 50 therefore readily delivers the refrigerant W to the cooling target, whereby the cooling target is readily further cooled.

On the other hand, the width of the first catcher 51, the width of the second catcher 52, and the width of the third catcher 53 are each readily set at a relatively small value. The amount of refrigerant W held by each of the first catcher 51, the second catcher 52, and the third catcher 53 can therefore be reduced. The amount of refrigerant W held by the first catcher 51, the second catcher 52, and the third catcher 53 and hence left in the heat exchanger 30 can therefore be reduced, whereby the generated refrigerant W is readily delivered with no waste to the cooling target.

In the present embodiment, the following configurations and methods can also be employed.

The cooled part is not necessarily located in a specific position and may be located in any position downstream of the cooling target main body in the flowing direction of the air delivered from the cooling air blower to the cooling target. The cooled part may instead be located below the cooling target main body in the vertical direction. In this case, the air from the cooling air blower is delivered from above to below in the vertical direction. The cooled part may still instead be located on one side of the cooling target main body in the horizontal direction. In this case, the air from the cooling air blower is sent from the other side toward the one side in the horizontal direction. The cooled part does not necessarily have a specific shape.

The cooling target in the embodiment described above is the light modulation units, but not necessarily. The cooling target is not limited to a specific component and may be any component including the cooling target main body and the cooled part. The cooling target may include at least one of the light modulators, the light modulation units, the light source apparatus, a wavelength converter that converts the wavelength of the light outputted from the light source apparatus, a diffuser that diffuses the light outputted from the light source apparatus, and a polarization converter that converts the polarization direction of the light outputted from the light source apparatus. According to the configuration described above, each portion of the projector can be cooled in the same manner described above.

The cooling air blower in the embodiment described above is the first air blower 60 provided in the refrigerant generator 20, but not necessarily. The cooling air blower may be provided separately from the air blowers provided in the refrigerant generator 20. In this case, the air from the cooling air blower is readily sent to the cooling target main body and the cooled part in the presented order irrespective of the arrangement of the refrigerant generator 20 and the cooling target.

The heater is not limited to that in the embodiment described above. The heater may be in contact with the moisture absorbing/discharging member and heat the moisture absorbing/discharging member. In this case, the heater may not heat the air before passing through the moisture absorbing/discharging member.

In the embodiment described above, the description has been made with reference to the case where the present disclosure is applied to a transmission-type projector, and the present disclosure is also applicable to a reflection-type projector. The term "transmission-type" means that the light modulators each including a liquid crystal panel or any other component transmit light. The term "reflection-type" means that the light modulators reflect light. The light modulators are each not limited, for example, to a liquid crystal panel and may, for example, be a micromirror-based light modulator.

In the embodiment described above, the projector using the three light modulators has been presented by way of example. The present disclosure is also applicable to a projector using only one light modulator and a projector using four or more light modulators.

The configurations described in the present specification can be combined with each other as appropriate to the extent that the combination causes no contradiction between the combined configurations.

What is claimed is:

1. A projector including a cooling target, the projector comprising:
   a light source configured to emit light;
   a light modulator configured to modulate the light emitted from the light source in accordance with an image signal;
   a projection optical apparatus configured to project the light modulated by the light modulator; and
   a cooler configured to cool the cooling target based on transformation of a refrigerant into a gas,
   wherein the cooler includes
      a refrigerant generator configured to generate the refrigerant,
      a refrigerant sender configured to send the generated refrigerant toward the cooling target, and
      a cooling air blower configured to deliver air to the cooling target,
   the cooling target includes
      a cooling target main body, and
      a cooled part which is thermally coupled to the cooling target main body and to which the refrigerant is sent from the refrigerant sender, and
   the cooled part is disposed on a downstream of the cooling target main body in a flowing direction of the air delivered from the cooling air blower to the cooling target.

2. The projector according to claim 1,
   further comprising a light modulation unit including the light modulator and a holding frame holding the light modulator,
   wherein the holding frame includes a frame main body holding the light modulator and an extending part extending from the frame main body,
   the light modulation unit is the cooling target,
   the light modulator is the cooling target main body, and
   the extending part is the cooled part.

3. The projector according to claim 2,
   wherein the holding frame is made of metal.

4. The projector according to claim 3,
   wherein a material of the holding frame contains aluminum.

5. The projector according to claim 2,
   Wherein a thermal conductivity of the holding frame is higher than a thermal conductivity of the refrigerant sender.

6. The projector according to claim 1,
   wherein the cooled part is disposed above the cooling target main body in a vertical direction.

7. The projector according to claim 1,
   further comprising a refrigerant holder holding the refrigerant, and
   the refrigerant holder is provided at the cooled part.

8. The projector according to claim 7,
   wherein the refrigerant holder is attached to a surface of the cooled part and is formed of a porous member, and
   at least part of the refrigerant holder is exposed when viewed from a refrigerant holder side along a overlapping direction in which the refrigerant holder and the cooled part overlap.

9. The projector according to claim 8,
   further comprising a fixing member fixing the refrigerant holder,
   the fixing member fixes the refrigerant holder in such a way that the fixing member and the cooled part sandwich the refrigerant holder in the overlapping direction, and
   at least part of the refrigerant holder is exposed when viewed from a fixing member side along the overlapping direction.

* * * * *